United States Patent
Tawada

[19]

[11] Patent Number: 6,090,150
[45] Date of Patent: *Jul. 18, 2000

[54] METHOD OF DESIGNING CLOCK WIRING AND APPARATUS FOR IMPLEMENTING THE SAME

[75] Inventor: Shigeyoshi Tawada, Tokyo, Japan

[73] Assignee: NEC Corporation, Tokyo, Japan

[*] Notice: Under 35 U.S.C. 154(b), the term of this patent shall be extended for 1251 days.

[21] Appl. No.: 08/497,845

[22] Filed: Jul. 3, 1995

Related U.S. Application Data

[63] Continuation of application No. 07/996,621, Dec. 24, 1992, abandoned.

[30] Foreign Application Priority Data

Dec. 28, 1991 [JP] Japan ................................. 3-358665
Jan. 22, 1992 [JP] Japan ................................. 4-031471
Jan. 29, 1992 [JP] Japan ................................. 4-013551

[51] Int. Cl.$^7$ .................................................. G06F 17/50
[52] U.S. Cl. ................. 703/19; 395/500.07; 395/500.13
[58] Field of Search ..................................... 364/488, 489, 364/490, 491; 395/500.07, 500.13, 500.14; 703/19

[56] References Cited

U.S. PATENT DOCUMENTS

| | | | |
|---|---|---|---|
| 4,263,651 | 4/1981 | Donath et al. ........................... | 364/491 |
| 4,642,890 | 2/1987 | Hechtman et al. ...................... | 364/488 |
| 4,694,403 | 9/1987 | Nomura .................................. | 364/488 |
| 4,698,760 | 10/1987 | Lembach et al. ....................... | 364/490 |
| 5,077,676 | 12/1991 | Johnson et al. ......................... | 364/489 |
| 5,168,455 | 12/1992 | Hooper .................................... | 364/489 |
| 5,191,541 | 3/1993 | Laudman et al. ....................... | 364/489 |
| 5,208,764 | 5/1993 | Rusu et al. .............................. | 364/489 |
| 5,410,491 | 4/1995 | Minami ................................... | 364/491 |

OTHER PUBLICATIONS

Hitchock, Sr. et al., "Timing Analysis of Computer Hardware," IBM J. of Res. & Dev., Jan. 1982, pp. 100–105.

Hitchcock, Sr. et al., "Timing Analysis of Computer Hardware", IBM J. Res Dev., vol. 26, No. 1, Jan. 1982.

Cho et al., "A Buffer Distribution Algorithm for High Performance Clock Net Optimization," IEEE, 1995, pp. 84–97.

Kahng, et al., "High–Performance Clock Routing Based on Recursive Geometric Matching", 28th ACM/IEEE Design Automation Conference, 1991, pp. 322–327.

*Primary Examiner*—Kevin J. Teska
*Assistant Examiner*—Thai Phan
*Attorney, Agent, or Firm*—Foley & Lardner

[57] ABSTRACT

In laying out the wiring of an LSI, PWB or the like, based on the logical connection information, layout result information, delay analyzing information or the like, the delay time margins for the entire path is evaluated by means of a delay analyzing means to detect a worst case path having the worst delay time margin from among the delay time margins for each path by means of a worst case path detecting means. A difference between the delay time margin of a secondary worst case path having the worst delay time margin among the next stage paths of this worst case path and the delay time margin of the preceding worst case path is evaluated by means of a clock skew adjusting time extracting means. Within the range of this clock skew adjusting time, an optimum delay time to be added is calculated by means of an additional delay time calculating means. A delay gate is inserted in the middle of the clock net for logical change by means of delay gate inserting means so that the calculated delay time is added to the clock net leading to the cock input terminal of the flip-flop at the terminal side of the worst case path.

19 Claims, 12 Drawing Sheets

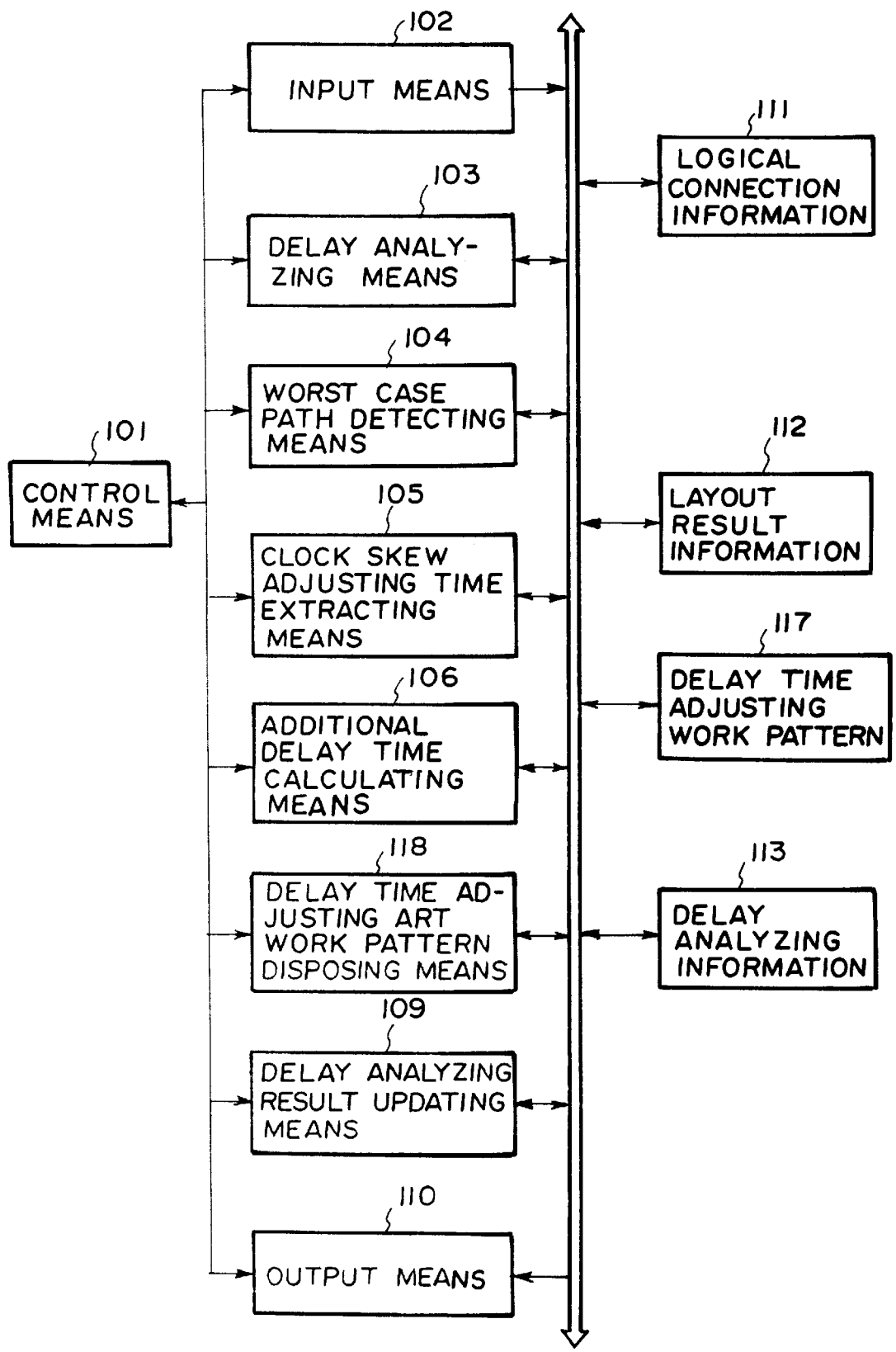

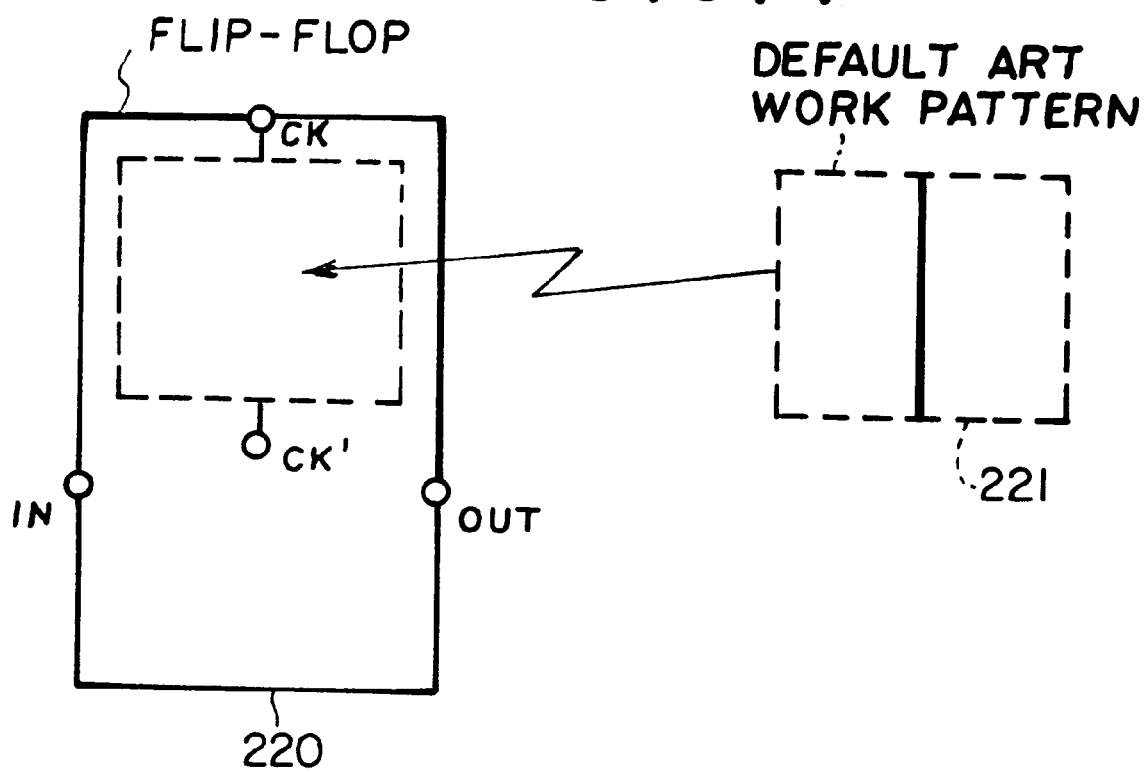

FIG. 9(b)
| NAME OF ART WORK PATTERN | ADDITIONAL DELAY TIME | DISPOSED ART WORK PATTERN |
|---|---|---|
| 222 | 2ns | 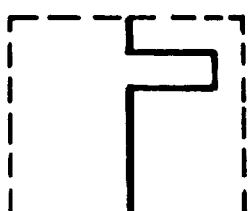 |
| 223 | 4ns | 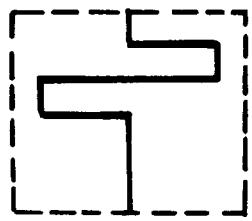 |
| 224 | 6ns | 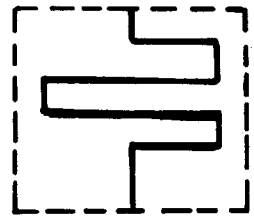 |
| 225 | 8ns | 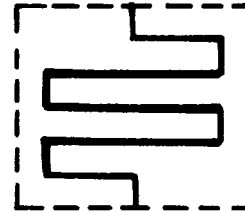 |
| ⋮ | ⋮ | ⋮ |

METHOD OF DESIGNING CLOCK WIRING AND APPARATUS FOR IMPLEMENTING THE SAME

This application is a continuation of application Ser. No. 07/996,621, filed Dec. 24, 1992 now aban.

BACKGROUND OF THE INVENTION

The present invention relates to a method of designing clock wiring and an apparatus for designing clock wiring for, example, an LSI, PWB or the like.

In the conventional method of designing clock wiring, among the automatic layout tools, stress has been laid on the reduction of clock skew among the automatic layout tool and the shortening of the path length of the worst case path to shorten the path delay time in order to design the layout and wiring, and after the layout is completed, the clock wiring has not specifically been modified. In particular, if it is necessary to shorten the clock cycle, instead of modifying the clock cycle, the path length of the worst case path has been manually shortened to modify the layout or wiring.

FIG. 1 is an example of a layout result of a conventional clock wiring system, in which clock drivers (depicted by "C.D." in the drawing) 201 through 203, flip-flops (F.F.) 204 through 206 operating by the rise of the clock, gates (G) 207 through 211, clock nets 212 through 214 and each net on paths 215, 216 are interconnected so that the clock skew becomes small and the delay time through the path is shortened.

Here, the clock nets 212 through 214 are wired at equal lengths and the clock skew is zero, and the paths 215, 216 are also wired with the shortest route. Let us assume that, according to the result obtained by a delay analysis, the path 215 comprises a delay time of 10 [ns] and is the worst case path smallest in the delay time margin, and the delay time for its next stage path 216 is 6 [ns].

FIG. 2 is a timing chart of the input waveform and the output waveform at the input terminals H01, H02 and H03 of flip-flops 204, 205, 206 and the input waveform at the clock input terminals CK1, CK2, CK3 of the flip-flops 204, 205, 206 when the cycle of the clock generated from the clock drivers 201 through 203 as shown in FIG. 1. Incidentally, let us assume that the set up time of the flip-flops 204, 205, 206 is zero and also that the waveform is free of any rounding.

As illustrated in FIG. 2, the output waveform of the output terminal N01 of the flip-flop 204 is applied to the input terminal H02 of the flip-flop 205 with a delay of 10 [ns], and is taken into the flip-flop 205 when the clock applied to the clock input terminal CK2 rises. Further, the output waveform of the output terminal N02 of the flip-flop 205 is applied to the input terminal H03 with a delay of 6 [ns], and is taken into the flip-flop 206 when the clock applied to the clock input terminal CK3 rises.

Therefore, since the delay time of the path 215 comprises 10 [ns], if the clock cycle is made smaller than 10 [ns], then the flip-flop 205 takes in the state of the input terminal H02 before the state change at the output terminal N01 of the flip-flop 204 propagates at the input terminal H02 making it impossible to achieve normal operation. That is, if the layout and the wiring are carried out according to the conventional clock wiring system, then the clock cycle can be limited by the worst case path with the longest delay time and, further, if the work for shortening the delay time of the worst case path is manually carried out, it can call for a great number of man-days. In particular, as the circuit becomes large-scale, in order to improve its performance, its modifying work also tends to increase, which in turn abruptly increases the number of man-days required for it.

SUMMARY OF THE INVENTION

Accordingly, an object of the present invention is to provide a method of designing the clock wiring system and an apparatus for implementing the same which allow the reduction of the clock cycle and the modification of the circuit to be promptly achieved as the circuit operation is speedized.

According to the present invention, there is provided, in an apparatus for designing layout and wiring of an LSI, PWB or the like using a clock wiring designing apparatus, said clock wiring designing apparatus comprising:

delay analyzing means for evaluating the delay time margins for all paths;

means for detecting a path having the worst delay time margin among the delay time margins;

means for extracting a clock skew adjusting time for evaluating a difference between the delay time margin of a secondary worst case path having the worst delay time margin of the next stage paths of this evaluated worst case path and the delay time margin of said worst case path;

additional delay time calculating means for evaluating an optimum delay time to be added to the clock net leading to the clock input terminal at the terminal side of the worst case path within the range of this evaluated clock skew adjusting time; and means for inserting a delay gate in the middle of said clock net for logical change so that the delay time evaluated by this additional delay time calculating means is added to the clock net.

Further, there is also provided, in an apparatus for designing layout and wiring of an LSI, PWB or the like using a clock wiring designing apparatus, said clock wiring designing apparatus comprising:

a delay analyzing apparatus for evaluating the delay time margin for all paths;

means for detecting a path having the worst delay time margin among the delay time margins;

clock skew adjusting time extracting means for evaluating a difference between the delay time margin of a secondary worst case path having the worst delay time margin among the next stage paths of the evaluated worst case path and the delay time margin of said worst case path;

additional delay time calculating means for evaluating an optimum delay time to be added to the clock net leading to the clock input terminal at the terminal side of the worst case path within the range of the evaluated clock skew adjusting time;

means for inserting a delay gate in the middle of the way of the clock net for logical change so that this delay time evaluated by the additional delay time calculating means is added to the clock net leading to the clock input terminal at the terminal side of the worst case path;

means for laying out the delay gate added by said delay gate inserting means and wiring the net leading to it;

delay analyzing result updating means for calculating the delay time margin again for the path which has suffered a change to its clock skew by the modification of the layout and wiring of the delay gate and the clock net by said layout/wiring modifying means to update the delay analyzing result; and output means for generating the changed layout result.

Still further, according to the present invention, there is also provided a clock wiring designing system comprising:

means for analyzing a delay time margin for each path to store into a storage means;

means for detecting a worst case path having the worst delay time margin based on the delay time margin for each path which is stored within said storage means;

clock skew adjusting time extracting means for extracting a difference between the delay time margin of the worst case path detected by said worst case path detecting means and the delay time margin of a secondary worst case path having the worst delay time margin among the next stage paths of the worst case path detected by said worst case path detecting means as the clock skew adjusting time;

an additional delay time calculating means for calculating the time corresponding to the clock skew adjusting time extracted by said clock skew adjusting time extracting means as the additional delay time;

means for changing the shape of said clock net so that the additional delay time calculated by said delay time calculating means is added to the clock net leading to the clock input terminal of the flip-flop at the terminal side of the worst case path detected by said worst case path detecting means; and delay analyzing result updating means for updating the delay time margin corresponding to the clock net whose shape has suffered a change by said clock net shape changing means among the delay time margins for each path stored within said storage means.

In a preferable embodiment of the present invention, a system for designing clock wiring in designing layout of an LSI, PWB or the like comprising:

a plurality of flip-flops each having an area where an art work pattern for adjusting the delay time is applied and disposed to apply the delay time to the clock input terminal;

input means for entering the layout result and the delay analyzing information including the interconnection information, art work pattern information for adjusting the delay time and the layout of the entire block including the flip-flop and the clock net wiring;

delay analyzing means for evaluating the delay time margin of said path for the clock cycle given over the entire path by said delay analyzing information;

means for detecting the worst case path having the worst delay time margin from among the delay time margins of each path which are evaluated by said delay analyzing means;

clock skew adjusting time extracting means for evaluating the difference between the delay time margin of the secondary worst case path having the worst delay time margin among the next stage paths of said worst case path, which are detected by said worst case path detecting means, and the delay time margin of said worst case path, which is detected by said worst case path detecting means, as the clock skew adjusting time;

additional delay time calculating means for evaluating an optimum delay time to be added to said clock net leading to the clock input terminal of said flip-flop at the terminal side of said worst case path within the range of said clock skew adjusting time evaluated by said clock skew adjusting time extracting means; an art work pattern disposing means for adjusting the delay time for selecting said delay time adjusting art work pattern having the delay time closest go said delay time which is evaluated by said additional delay time calculating means to dispose at said area of said flip-flop;

delay analyzing result updating means for calculating the delay time margin again for the path whose clock skew has suffered a change by the disposition of said art work pattern by said art work pattern disposing means to update the delay analyzing result;

control means for driving said worst case path detecting means again if there is any other path having a delay time margin smaller than that of said worst path updated by said delay analyzing result updating means; and output means for generating the layout result including said area after the processing by said each pattern.

According to the present invention, it is possible to shorten the clock cycle more than the delay time of the worst case path by intentionally utilizing the clock skew with the result that the clock cycle can be shortened as the circuit operation is speedized to thereby promptly modify the circuit.

BRIEF DESCRIPTION OF THE DRAWINGS

FIG. 8 is a block diagram of the clock wiring designing system according to a third embodiment of the present invention;

FIGS. 9(a) and 9(b) show a delay adjusting art work pattern and the flip-flop arrangement, respectively;

DETAILED DESCRIPTION OF THE PREFERRED EMBODIMENTS

A specific embodiment of the present invention will be hereinafter described with reference to FIGS. 3 through 5.

Figure 3:
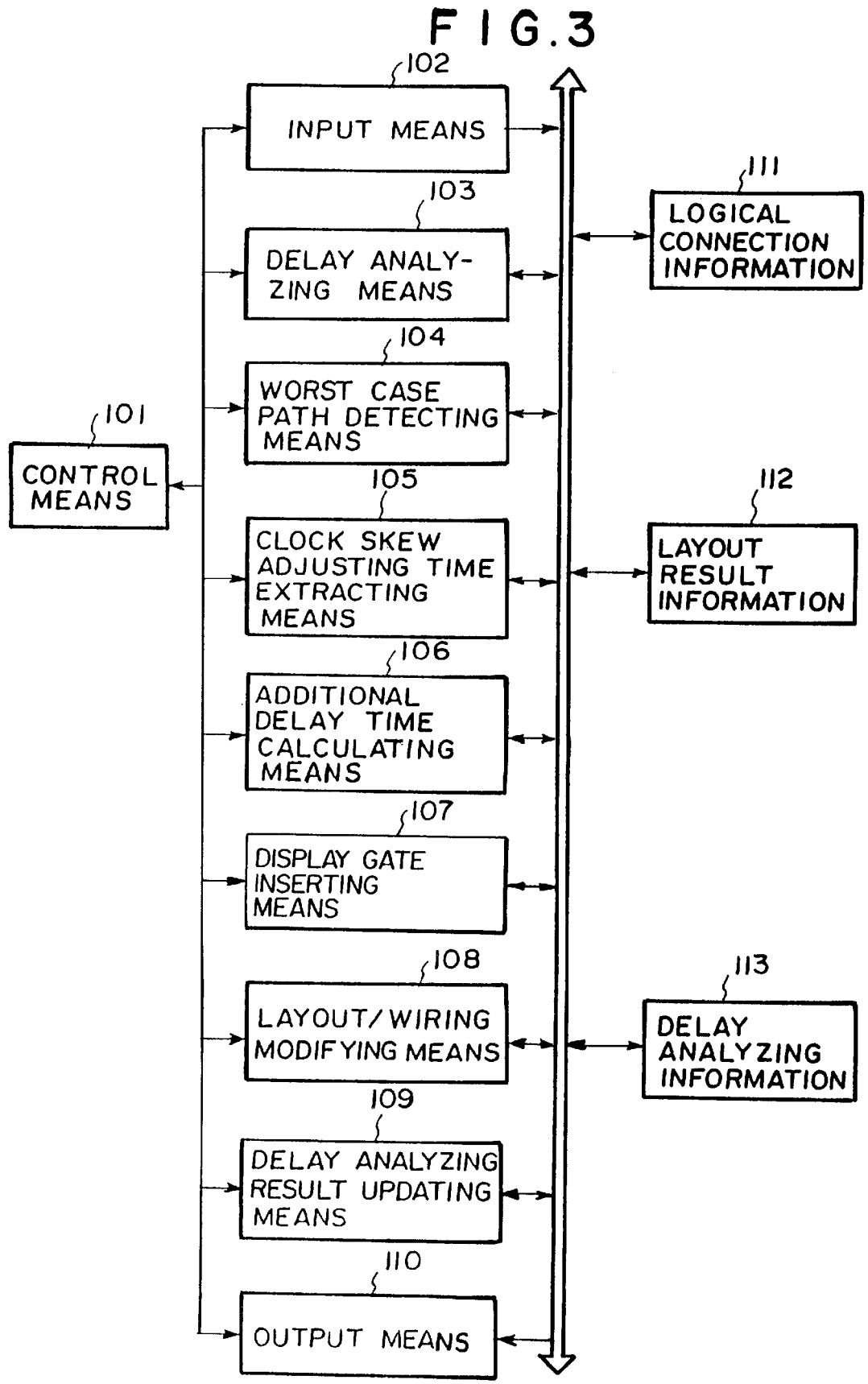
FIG. 3 is a block diagram of a clock wiring designing apparatus according to a first embodiment of the present invention.

A first embodiment illustrated in FIG. 3 comprises an apparatus for designing the layout/wiring for, for example, an LSI, PWB or the like comprising input means for entering the interconnection information 111, layout result information 112 including the clock net wiring, which is obtained after the layout and wiring has generally been and the delay analyzing information 113, delay analyzing means 103 for analyzing the delay in an across-the-board manner such as evaluating, over all the paths, delay time margin of the path and the delay time margin of the path comprising the difference between the clock cycle and the delay time of the path and the clock skew allowed for; and worst case path detecting means 104 for detecting a path (worst case path) having the worst delay time margin among ones for each path, which are evaluated by the delay analyzing means 103.

The apparatus further comprises clock skew adjusting time extracting means 105 for evaluating the difference between the delay time margin of a path (hereinafter referred to as a "secondary worst case path") having the worst delay time margin among the next stage paths of the worst case path detected by the worst case path detecting means 104, and the delay time margin of the worst case path detected by the worst case path detecting means and additional delay time calculating means 106 for evaluating an optimum delay time (in general, ½ of the clock skew adjusting time) to be added to the clock net leading to the clock input terminal of the flip-flop at the terminal side of the worst case path within the range of the clock skew adjusting time evaluated by the clock skew adjusting time extracting means 105.

Display gate inserting means 107 is provided for inserting a delay gate in the middle of the way of a clock net to change the logic so that the delay time evaluated by the additional delay time calculating means 106 is added to the clock net leading to the input terminal of the flip-flop at the terminal side of the worst case path, layout/wiring modifying means for laying out the delay gate added by the delay gate inserting means 107 and wiring the net leading to it, delay analyzing result updating means 109 for calculating the delay time margin for the path which has suffered a change in clock skew when the layout and the wiring of the delay gate and the clock net are modified by the layout/wiring modifying means to update the delay analyzing result, output means 110 for generating the changed layout result and control means 101 for controlling each of the foregoing means.

The operation of the foregoing first embodiment illustrated in FIG. 3 will be hereinafter described in contrast to the foregoing conventional embodiment. First, let us assume that, using a conventional technique, as shown in FIG. 1, clock drivers 201 through 203, flip-flops 204 through 206 and gates 207 through 211 are disposed, and then clock nets 212 through 214 and each net on paths 215, 216 are wired.

If the clock nets 212 through 214 are wired at equal lengths, the clock skew is 0 and the buses 215, 216 are wired with the shortest route. Further, let us assume that according to the result of the delay analysis bus 215 comprises a delay time of 10 [ns], which is the worst case path smallest in the delay time margin and that the delay time of the next stage path 216 is 6 [ns]. In the conventional apparatus shown in FIG. 1, since the clock skew is also 0, it cannot be made smaller than this. Further, since the path length of the worst case path cannot be made shorter than this, the clock cycle is defined by the worst case path 215 and the clock cycle cannot be made shorter than 10 [us].

Figure 2:
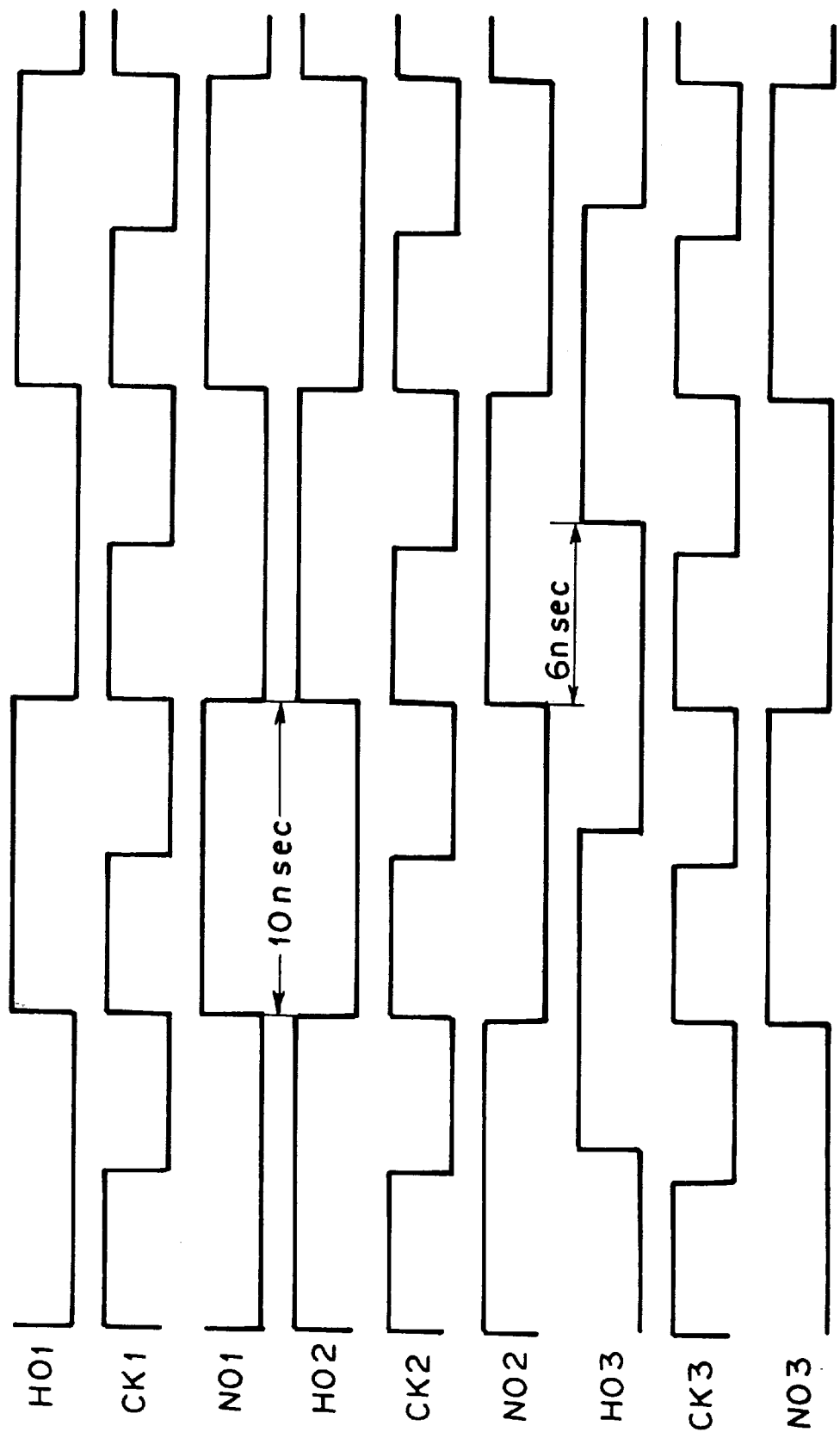
FIG. 2 is a timing chart of the operation for the layout in the conventional system shown in FIG. 1.

In addition, FIG. 2 illustrates a timing chart of the data waveform at the input terminals H01, H02, H03 of the flip-flops 204, 205, 206 and of the clock waveform at the clock input terminals CK1 through CK3 of the flip-flops 204 through 206 according to the result by the conventional technique when the clock cycle comprises 10 [ns]. For the sake of simplicity, here, let us assume that there is no delay time within the flip-flop or rounding of each waveform and that the flip-flop operates by the rise of the clock, as apparent from this Figure, the clock cycle cannot be shortened up to below 10 [ns].

Figure 1:
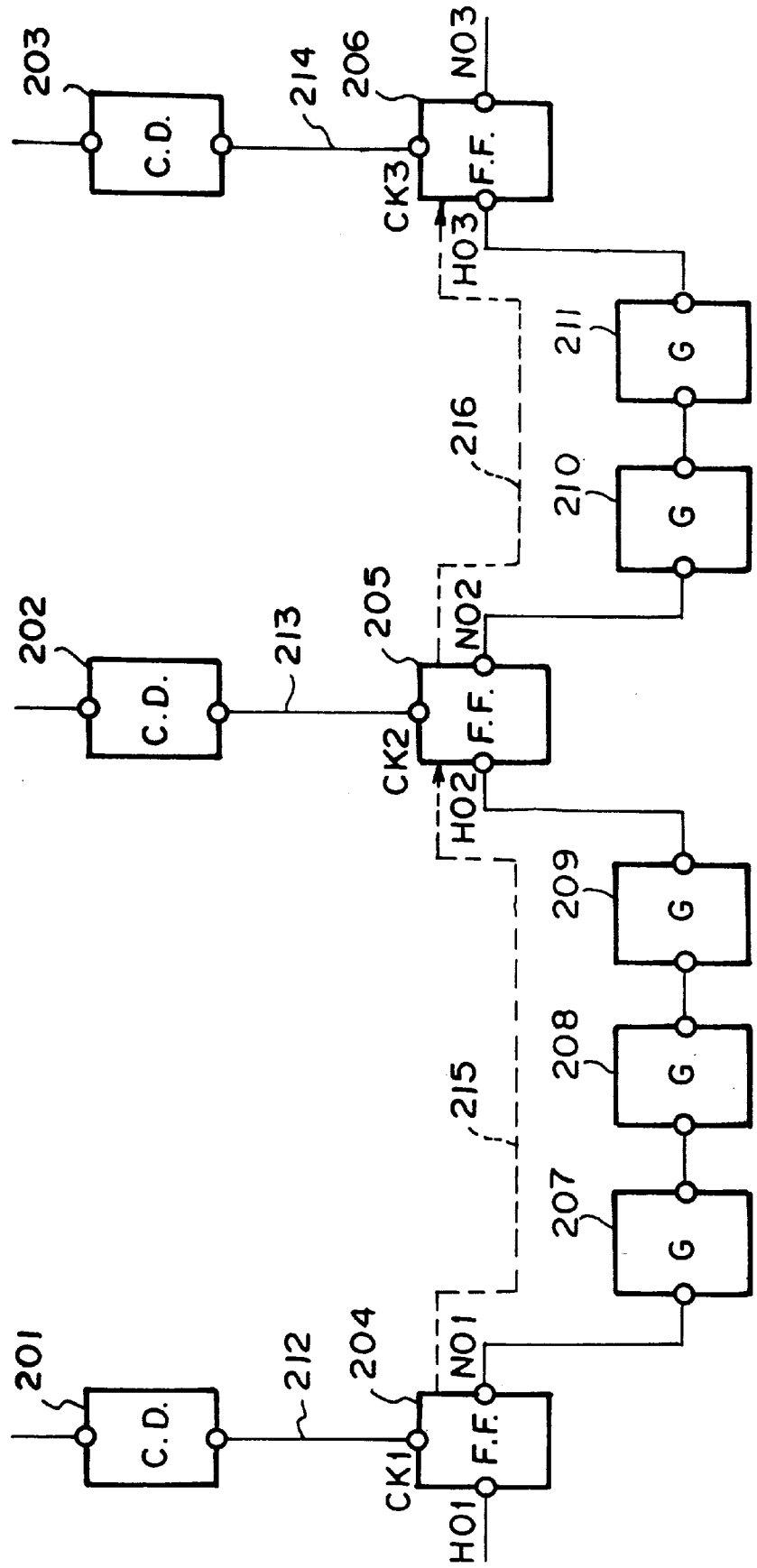
FIG. 1 is a view of the example of a layout in a conventional clock wiring designing system.

In the clock wiring designing apparatus according to the first embodiment, after the layout has been completed according to the conventional system in FIG. 1, first, its layout result information 112, interconnection information 111 and the delay analyzing information 113 are entered to the input means 102 in FIG. 3. Next, by the delay analyzing means 103 shown in FIG. 3, the delay analysis is carried out at the clock cycle of 10 [ns] to evaluate the delay time margin over the entire path. Based on its analyzing result, the worst case path detecting means 104 shown in FIG. 3 detects the path 215 having the worst delay time margin of 10 [ns] as the worst case pate Next, by the clock skew adjusting time extracting means 105 shown in FIG. 3, the difference between the delay time margin 4 [ns] of the secondary worst case path 216 having the worst delay time margin among the next stage path (here, only the path 216) of the worst case path 215 and the delay time margin 10 [ns] of the worst case path is extracted as the clock skew adjusting time. Next, by the additional delay time calculating means in FIG. 3, the delay time to be added to the clock net 213 is calculated as ½ (2 [ns]) of 4 [ns] within the range of the clock skew adjusting time 4 [ns].

Figure 4:
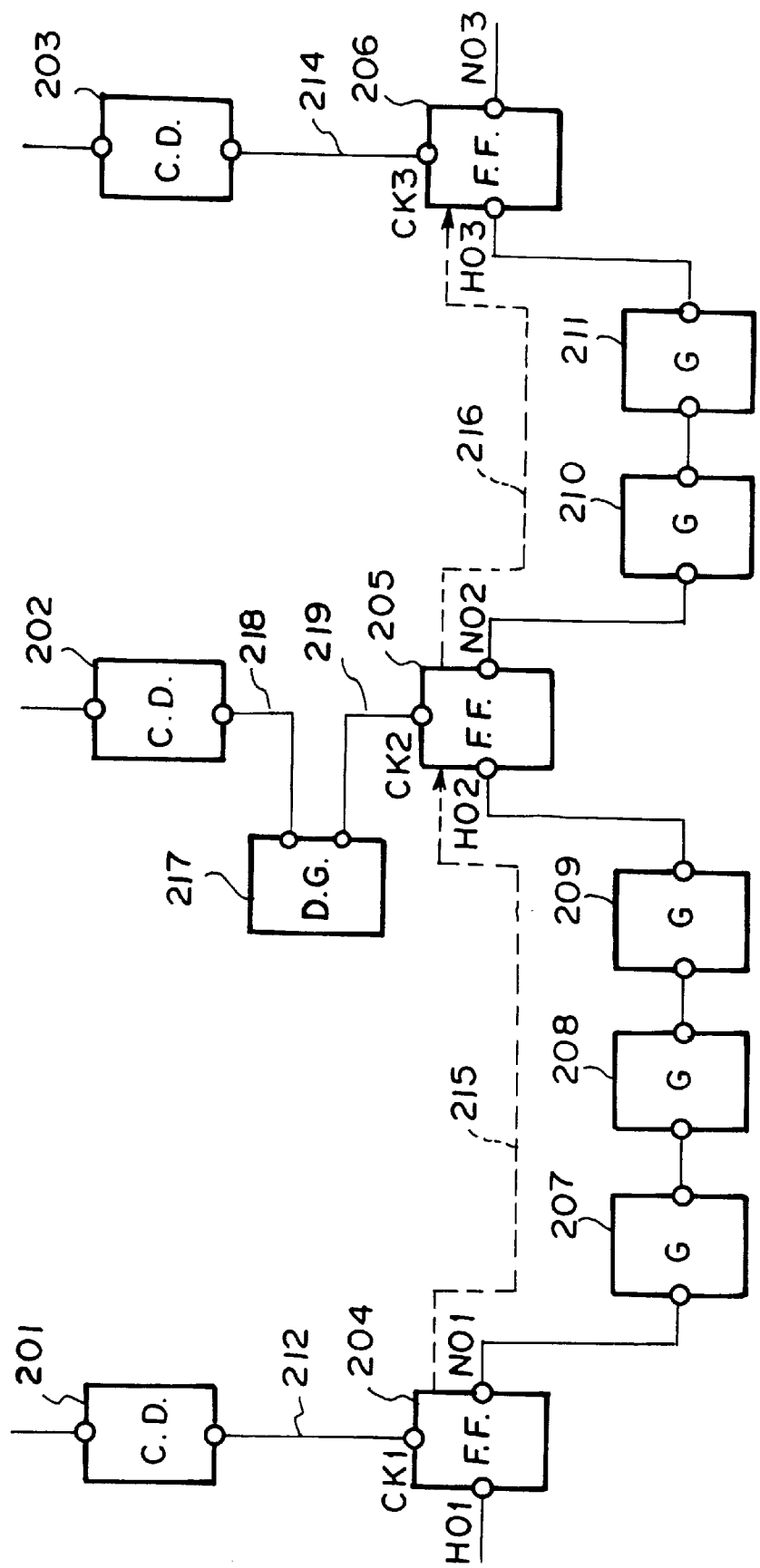
FIG. 4 explanatory shows an example of the layout result in which each net implementing the embodiment in FIG. 3 is wired.

As shown in FIG. 4, the delay gate inserting means 107 in FIG. 3 inserts the delay gate 217 having the delay time corresponding to the additional delay time of 2 [ns] in the middle of the clock net 213 in FIG. 1, and the clock net 213 is divided into two clock nets 218, 219 via the delay gate 217. Next, by the layout/wiring modifying means 108 in FIG. 3, the delay gate 217 is laid out and the clock nets 218, 219 are wired to evaluate a new wiring route of the clock nets 218, 219 sandwiching the delay gate 217, as shown in FIG. 4. This is the example of the wiring route of the clock net which allows the clock cycle to be shortened.

By the delay analyzing result means 109, the delay time margins of the paths 215 and 216 are updated and both becomes 2 [ns]. At this time, assuming that the worst value (minimum value) of the delay time margin over the entire path is 2 [ns], even if the clock cycle is set to 8 [ns], the clock skew serves as a buffer, and the timing chart of the data waveform at the input terminals H01, H02, H03 of the flip-flops 204, 205, 206 and of the clock waveform at the input terminals CK1 through CK3 of the flip-flops 204 through 206 results in the signals in FIG. 5 and the circuit normally operates.

The foregoing process is repeated for the worst case path updated one after another by mean of the control means 101 to increase its delay time margin so that the clock cycle for the delay time margin of the worst case path can be made shorter, and the changed layout result is generated from the output means 110.

Next, a second embodiment of the present invention will be described in detail with reference to FIGS. 6 and 7.

Figure 6:
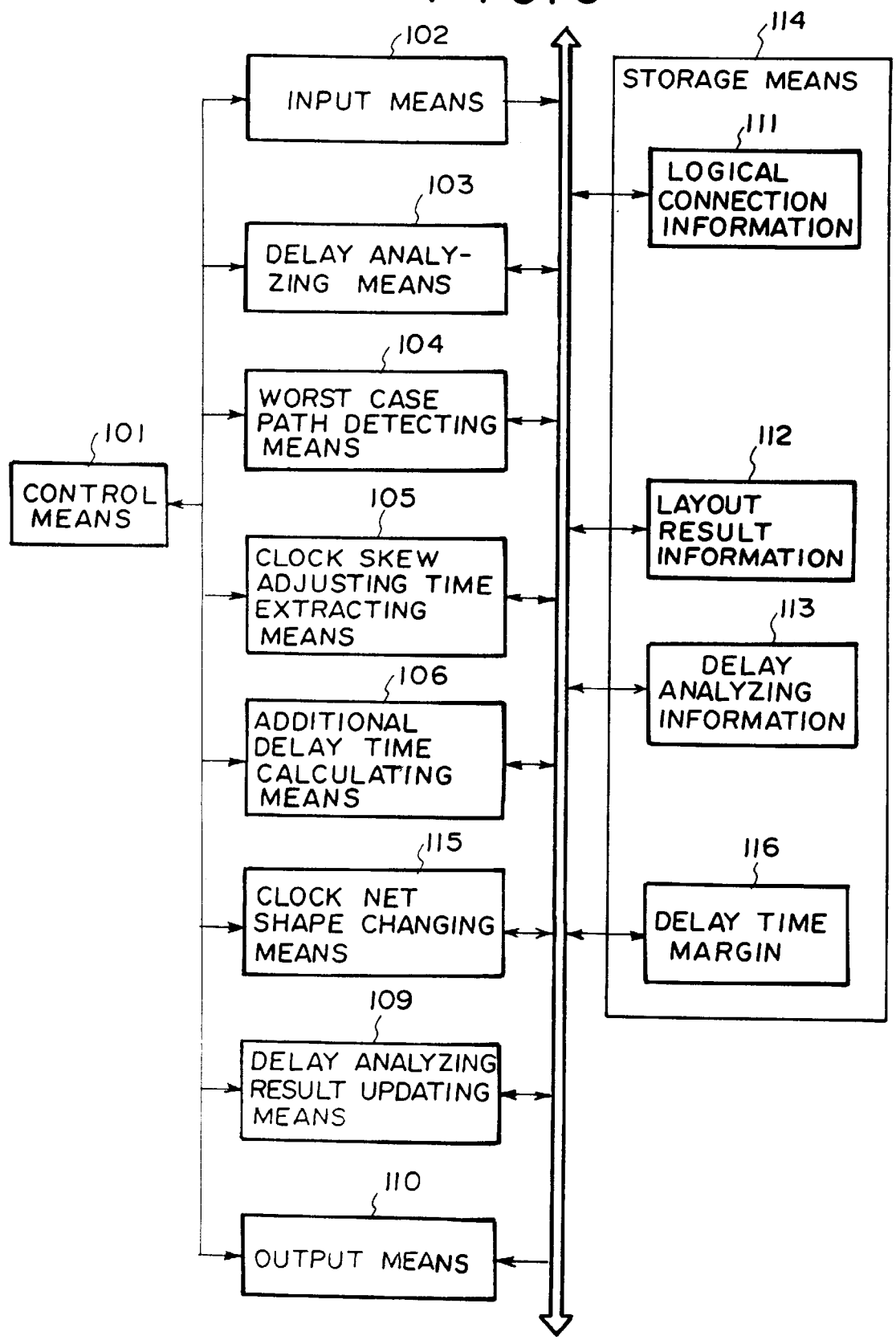
FIG. 6 is a block diagram of the clock wiring designing system according to a second embodiment of the present invention.

In FIG. 6, the second embodiment comprises control means 101, input means 102, delay analyzing means 103, worst case path detecting means 104, clock skew adjusting time extracting means 105, additional delay time calculating means 106, clock net shape changing means 115, delay analyzing result updating means 109, output means 110 and storage means 114 for storing logic interconnection information 111, layout result information 112, delay analyzing information 113 and a delay time margin 116.

The control means 101 controls each means 102 through 110 and 115.

The input means 102 enters the logic connection information 111, layout result information 112 and delay analyzing information 113 stored within the storage means 114.

The delay analyzing means 103 first evaluates the delay times for each path based on the logic connection information 111, layout result information 112 and delay analyzing information 113 entered by the input means 102. Next, the longest delay time is extracted from among the evaluated delay time for each path to evaluate the difference between the longest delay time and the delay time of each path. Based on the evaluated difference and the corresponding clock skew of the path, the delay time margin of each path is evaluated to store into the storage means 114.

The worst case path detecting means 104 detects the path having the worst delay time margin (the shortest delay time margin) as the worst case path based on the delay time margin of each path which is stored within the storage means 114 to inform the clock skew adjusting time extracting means 105 of all of them.

The clock skew adjusting time extracting means 105 extracts the difference between the delay time margin of the worst case path, which is informed from the worst case path detecting means 104, and the delay time margin of the path (secondary worst case path) having the worst delay time margin among the next stage paths of the worst case path as the clock skew adjusting time to inform the additional delay time calculating means 106 of the extracted clock skew adjusting time and the foregoing worst case path. However, if the extracted clock skew adjusting time is 0 [ns], they are no informed, but the effect is informed the control means 101.

The additional delay time calculating means 106 calculates the ½ time of the clock skew adjusting time informed from the clock skew adjusting time extracting means 105 as the additional delay time to be added to the clock net connected to the clock input terminal of the flip-flop at the terminal side of the worst case path, which is informed from the clock skew adjusting time extracting means 105, to inform the clock net shape changing means 115 and the delay analyzing result updating means 109 of the calculated additional delay time and the foregoing worst case path. Incidentally, the additional delay time added to the clock net may be arbitrary if below ½ of the clock skew adjusting time. However, it may preferably be ½ because, in that case, the clock cycle can be made shortest.

The clock net shape changing means 115, based on the additional delay time and the worst case path informed from the additional delay time calculating means 106, changes the information regarding the clock net connected to the clock input terminal of the flip-flop at the terminal side of the foregoing worst case path among the layout result information 112 to change the shape of the foregoing clock net so that the delay time of the clock net shown by the changed layout result information 112 becomes longer than the delay time of the clock net shown by the changed layout result information 112 by the additional delay time informed from the additional delay time calculating means 106.

The delay analyzing result updating means 109 updates the delay time margin 116 stored within the storage means 114 base on the delay time to be added and the worst case path which are informed from the additional delay time calculating means 106.

The output means 110 generates the layout result information 112 and the worst of the delay time margin 116.

The operation of the above second embodiment will be described.

First, the control means 101 controls the input means 102 to enter the logic connection information 111, layout result information 112 and the delay analyzing information 113 from the storage means 114. Incidentally, the layout result information 112 is obtained according to the conventional clock wiring system. Here, it shows the layout in FIG. 1.

When the input means 102 enters the logic connection information 111, layout result information 112 and delay analyzing information 113, then the control means 101 operates the delay analyzing means 103.

Thus the delay analyzing means 103 evaluates the delay time of each path 215, 216 based on the information entered by the input means 102. Here, since the layout result information 112 shows the layout in FIG. 1, the delay time of the paths 215, 216 become 10 [ns] and 6 [ns], respectively.

Next, the delay analyzing means 103 extracts the longest delay time from among the delay times for each path 215, 216. In this embodiment, the delay time 10 [ns] of the path 215 will be extracted.

Thereafter, the delay analyzing means 103 evaluates the delay time margin of each path 215, 216 based on the difference between the delay time of the longest path 215 and the delay time of each path 215, 216 and the clock skew 0 [ns] of each path 215, 216 to store into the storage unit 114 as the delay time margin 116. Incidentally, in this embodiment, the delay time margin of each path 215, 216 will becomes 0 [ns] and 4 [ns] respectively.

When the processing of the delay time analyzing means 103 is completed, the control means 101 operates the worst case path detecting means 104.

Thus, the worst case path detecting means 104 detects the path 215 having the worst delay time margin 0 [ns] out of the paths 215, 216 as the worst case path based on the delay time margin 116 stored within the storage means 114 to inform the clock skew adjusting time extracting means 105.

When the worst case path detecting means 104 has completed processing, the control means 101 operates the clock skew adjusting time extracting means 105.

Thus, the clock skew adjusting time extracting means 105 extracts the delay time margin 0 [ns] of the worst case path 215 which is informed from the worst case path 104 and the delay time margin 4 [ns] of the secondary worst case path 216 having the worst delay time margin among the next stage paths (in this example, only the path 215) of the worst case path 215 to inform the additional delay time calculating means 106 of the extracted clock skew adjusting time 4 [ns] and the worst case path 215.

When the clock skew adjusting time extracting means 105 has completed the processing, the control means 101 operates the additional delay time calculating means 106.

Thus, the additional delay time calculating means 106 calculates ½ (2 [ns]) of the clock skew adjusting time 4 [ns], which is informed from the clock skew adjusting time extracting means, as the additional delay time to be added to the clock net 213 leading to the clock input terminal CK2 of the flip-flop 205 at the terminal side of the worst case path 215 to inform the clock net shape changing means 115 and the delay analyzing result updating means 109 of the calculated additional delay time 2 [ns] and the worst case path 215.

The control means 101, when the processing by the additional delay time calculating means 106 is completed, operates the clock net shape changing means 115 and the delay analyzing result updating means 109.

Based on the additional delay time 2 [ns] and the worst case path 215, which are informed from the additional delay time calculating means 106, the clock net shape changing means 115 changes the information regarding the clock net 213 within the layout result information 112 to change the shape of the clock net 213 so that the delay time of the clock net 213 shown by the changed layout result information 112 becomes longer than the delay time of the clock net 213 shown by the layout result information 112 before changed by the delay time 2 [ns] informed from the additional delay time calculating means 106. As a result, the shape of the clock net 213 results in one of, for example, FIG. 7 in which the original wiring route in FIG. 1 is bypassed.

Further, when the delay analyzing result updating means 109 is driven by the control means 101, it updates the delay time margins 116 of the worst case path 215 and the secondary worst case path 215 which are stored within the storage means 114 based on the additional delay time 2 [ns] and the worst case path 215, which are informed from the additional delay time calculating means 106. As a result, the delay time margin 116 of the worst case path 215 and the secondary worst case path 216 both become 2 [ns].

The control means 101, when the processing by the delay analyzing result updating means 109 is completed, operates the worst case path detecting means 104 again.

The worst case path detecting means 104 detects the path having the worst delay time margin as the worst path based on the delay time margin 116 stored within the storage means 114. In this case, since the delay time margins of the paths 215, 216 are stored within the storage means 114 as the delay time margin 116 and they are both 2 [ns], the worst case path detecting means 104 detects the paths 215, 216 as the worst case path to inform the clock skew adjusting time extracting means 105.

When the paths 215, 216 are informed as the worst case path, the clock skew adjusting time extracting means 105 references to the delay time margin 116 stored within the storage means 114 to calculate the difference between the delay time margin of the worst case path 215 and that of the secondary worst case path 216 as the clock skew adjusting time. In this case, since the delay time margins of the paths 215, 216 are both 2 [ns], the clock skew adjusting time becomes 0 [ns].

When the clock adjusting time becomes 0 [ns], the clock skew adjusting time extracting means 105 informs the control means 101 to that effect without informing the additional delay time calculating means 106 of the clock skew adjusting time.

When the control means 101 receives the foregoing information, it determines that the processing to shorten the clock cycle has completed to instruct the output means 110 to generate the layout result.

Upon receipt of this instruction, the output means 110 generates the layout result information 112 (showing the layout in FIG. 7) and the worst delay time margin 2 [ns] within the delay time margins 116, which are stored within the storage means 114.

Figure 7:
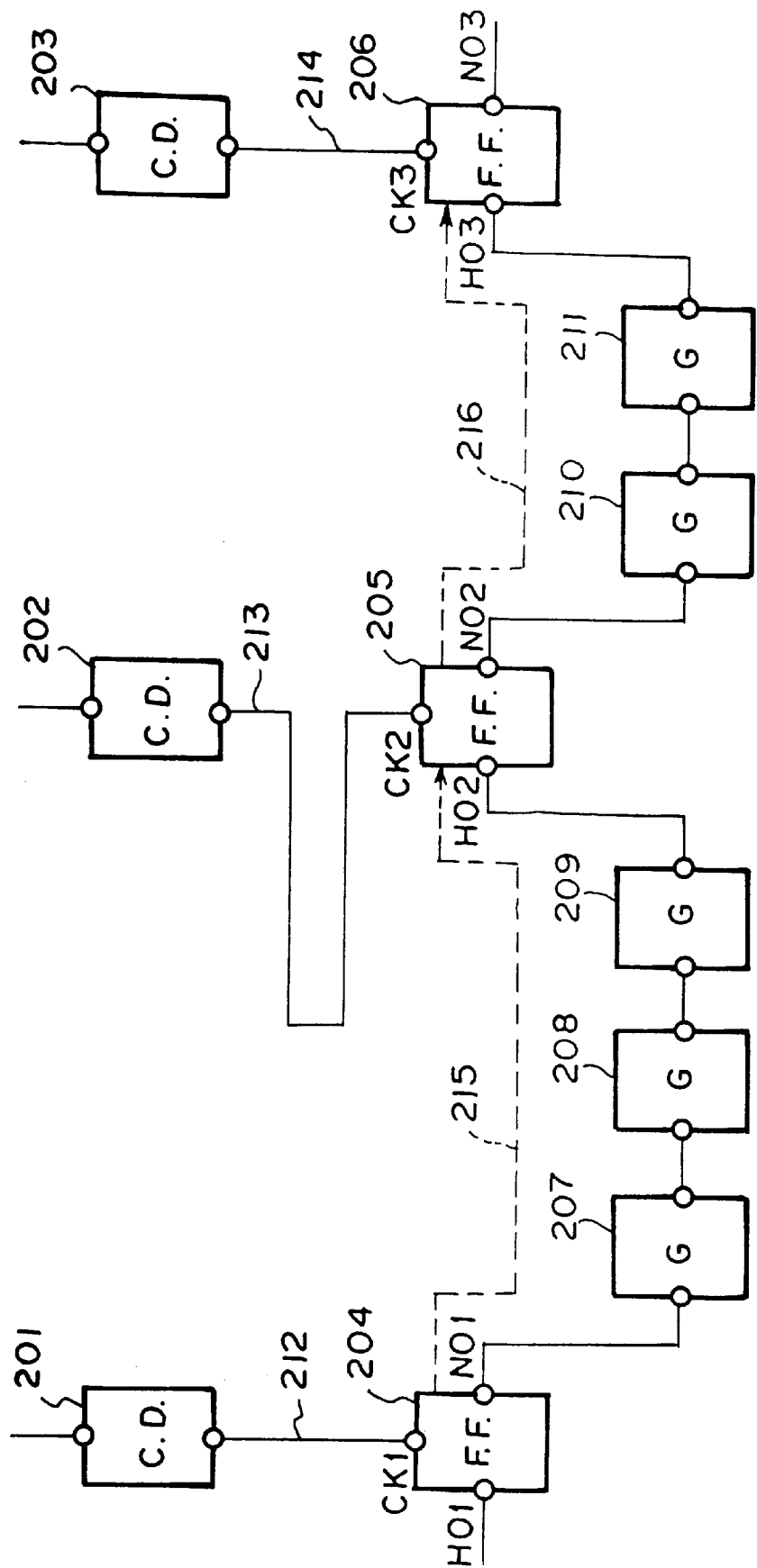
FIG. 7 is a view of an example of the layout result after the clock net was modified according to the embodiment in FIG. 6.

The layout generated from this output means 110, which is shown in FIG. 7, is the clock wiring allowing the clock cycle to be shortened, and the delay time margin 2 [ns] is the clock cycle which can be shortened than conventionally. That is, the shortest clock cycle has conventionally been 10 [ns], but the clock cycle can be reduced to 8 [ns] by carrying out the foregoing process.

Figure 5:
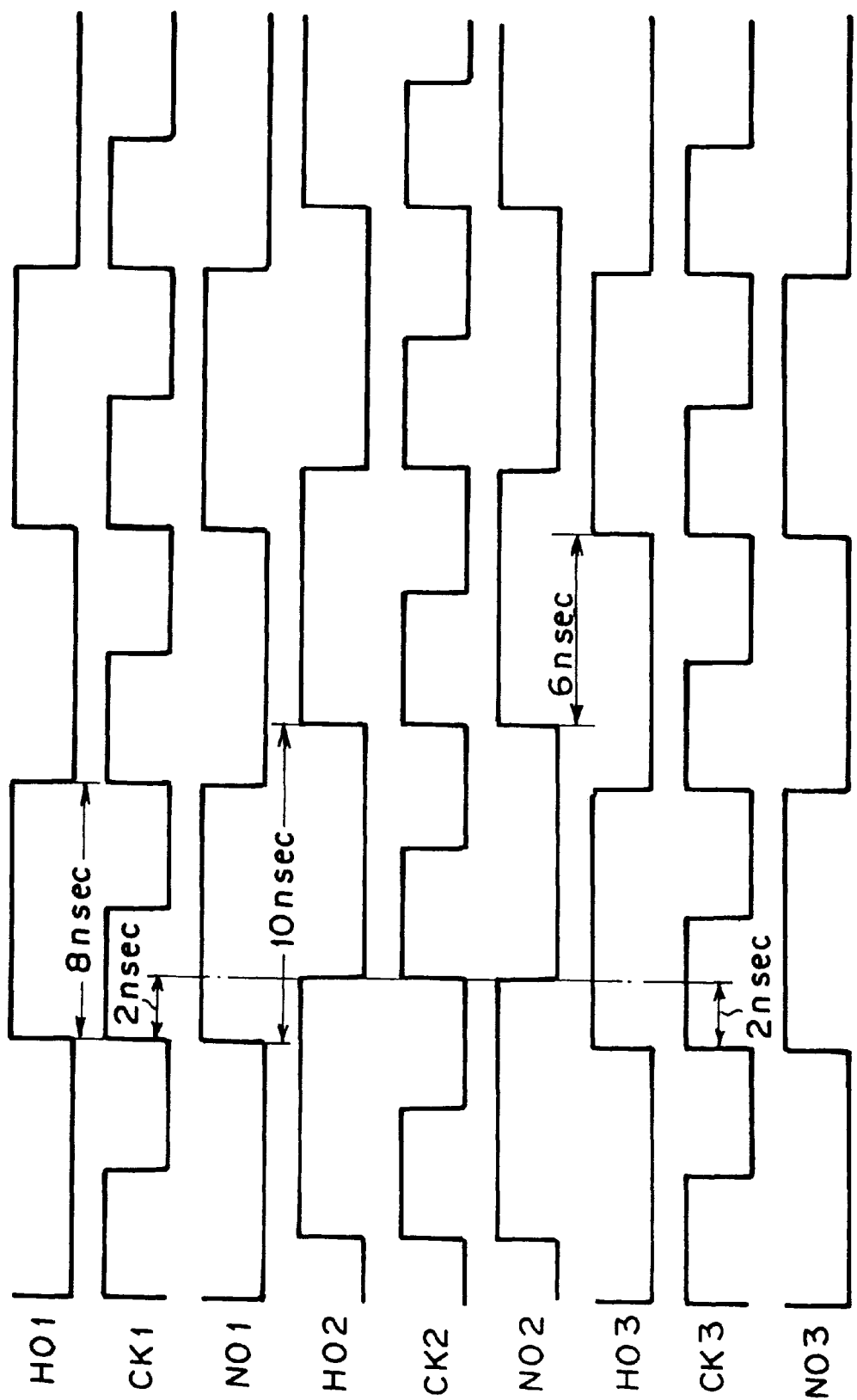
FIG. 5 is a timing chart of the operation for the layout result in FIG. 4.

When the cycle of the clock generated from the clock drivers 201 through 203 is 8 [ns] in FIG. 7, the input waveform at the input terminals HO, H02, H03 of the flip-flops 204, 205, 206, the output waveform at the output terminals N01, N02, N03 of the flip-flops 204, 205, 206 and the input waveform at the clock input terminals CK1, CK2, CK3 of the flip-flops 204, 205, 206 result as shown in FIG. 5, in which the delay time of the flip-flops 204, 205, 206 are 0 and there is no rounding in the waveform.

As shown in the same Figure, the clock supplied to the clock input terminal CK2 of the flip-flop 205 via the clock net 213 has a time skew of 2 [ns] for the clock supplied to the clock input terminals CK1, CK3 of the flip-flops 204, 206.

Therefore, even if the clock cycle is set to 8 [ns], it will be 10 [ns] after the state of the output terminal N01 of the flip-flop 204 has changed that the flip-flop 205 takes in the input waveform at the input terminal H02. That is, the flip-flop 205 will take in the input waveform when the state change of the output terminal N01 of the flip-flop 204 is delayed by 10 [ns] to propagate to the input terminal H02.

Further, the clock supplied to the clock input terminal CK3 of the flip-flop 206, since the time skew comprises 2 [ns], will rise 6 [ns] after the clock supplied to the clock input terminal CK2 of the flip-flop 205 rises, but since the delay time of the path 216 between the flip-flops 205 and 206 comprises 6 [ns], the flip-flop 206 can correctly take in the state change of the output terminal N02.

Even if the clock cycle is set to 8 [ns], the circuit will operate normally.

A still further embodiment of the present invention will be described with reference to FIGS. 8 through 11.

FIG. 8 is a block diagram of the clock wiring designing system according to the third embodiment of the present invention.

Figure 10:
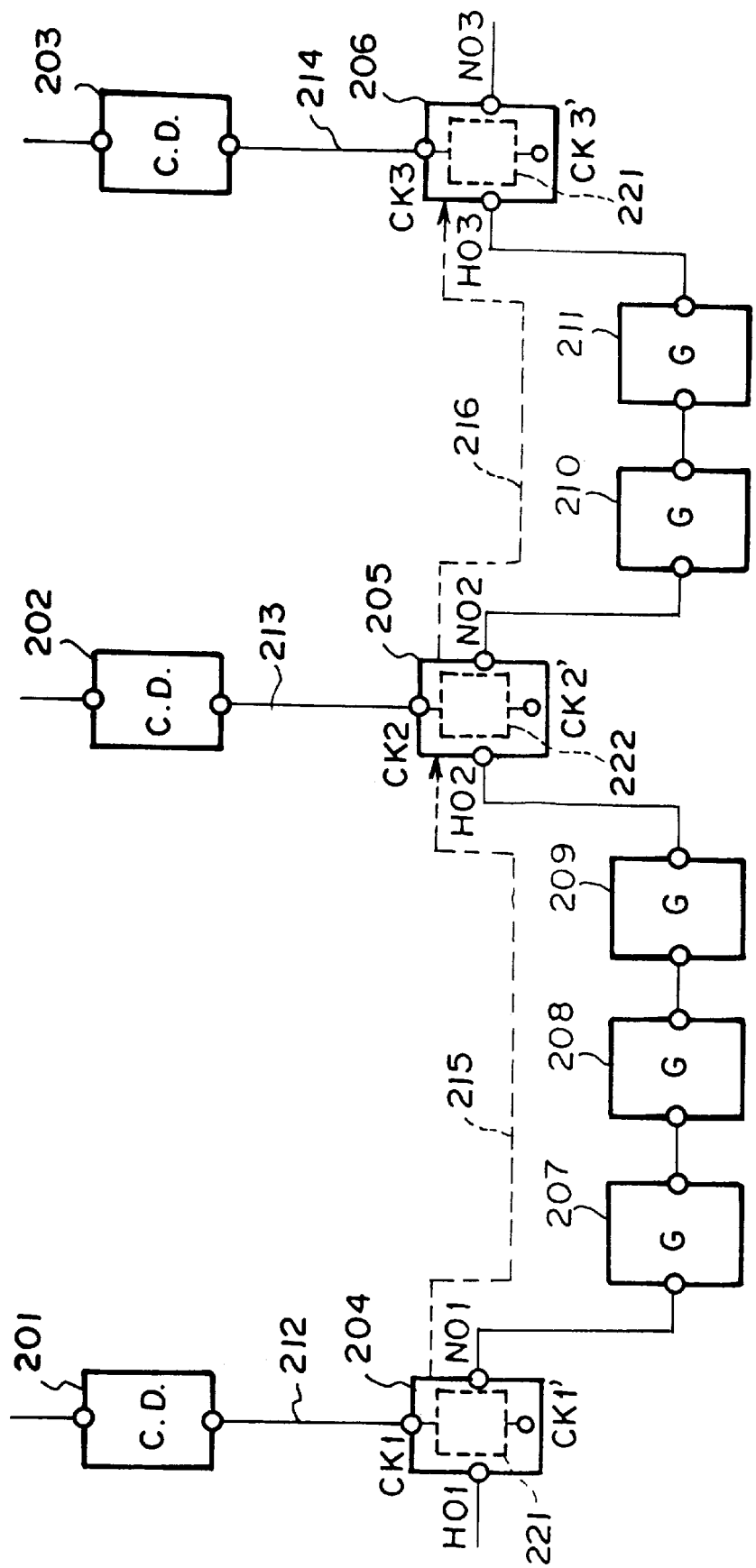
FIG. 10 shows an example of the layout result according to the embodiment in FIG. 8.

According to the third embodiment, as illustrated as a flip-flop 220 in FIG. 9(a) corresponding to the flip-flops 204, 205, 206 in FIG. 10, the original position of the clock input terminal (CK' in FIG. 9(a)) and the position of the clock input terminal (CK in FIG. 9(a)) which is to be automatically wired are interconnected in an art work pattern as the default art work pattern 221. In particular, if no layout art work pattern is specified, then the default art work pattern 221 is disposed on the clock input terminals of all the flip-flops. For the art work pattern, there is a plurality of other patterns each having an additional delay time as shown in 222 through 225 in FIG. 9(b), and they can be arbitrarily selected and disposed.

In this embodiment, after the layout has been completed as shown in FIG. 1, its layout result information 112, logic connection information 111, delay time adjusting art work pattern 117 and delay analyzing information 113 are entered by the input means 102. Next, the across-the-board delay analysis is conducted at the clock cycle of 10 [ns] by means of the delay analyzing means 103 to evaluate the delay time margins for all the paths. Based on that analyzing result, the worst case path detecting means 104 detects the path 215 having the worst delay time margin of 0 [ns] as the worst case path.

Next, by the clock skew adjusting time extracting means 105, the difference 4 [ns] between the delay time margin 4 [ns] of the secondary worst case path 216 having the worst delay time margin among the next paths (here, only the path 216) of the worst case path 215 and the delay time margin 0 [ns] is extracted as the clock skew adjusting time. Then, by the additional delay time calculating means 106, the delay time to be added to the clock net 213 leading to the clock input terminal CK2 of the flip-flop 205 at the terminal side of the worst case path 215 is calculated as ½ (2 [ns]) of 4 [ns] within the range of the clock skew adjusting time 4 [ns].

By virtue of the art work pattern layout means 118 for adjusting the delay time, the art work pattern 222 shown in FIG. 9(b) is selected so that the delay time corresponding to the additional delay time 2 [ns] is added, and is disposed at the clock input terminal CK2, as shown in FIG. 10. The wiring system obtained by combining the wiring result of the clock net 213 and the selected and disposed art work pattern 222 is an example of the clock wiring allowing the intended clock cycle to be shortened.

Figure 11:
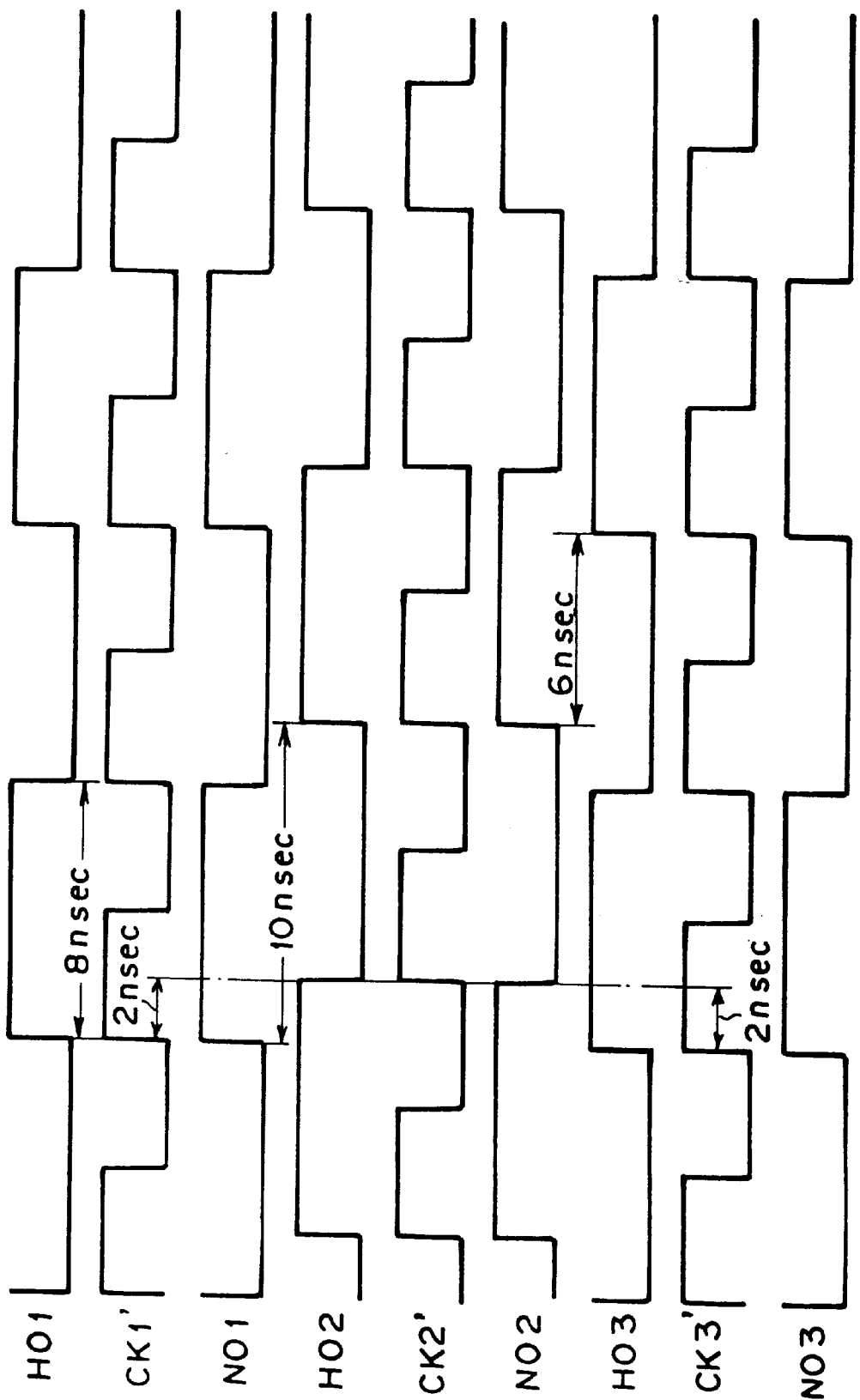
FIG. 11 is a timing chart of the operation according to the layout result in FIG. 10.

Next, by the delay analyzing result updating means 109, the delay time margins of the paths 215 and 216 are updated and both become 2 [ns]. At this point, if the worst value (minimum value) of the delay time margin over the entire path was 2 [ns], even if the clock cycle is 8 [ns], the clock skew serves as a buffer, and the timing chart of the waveform of the data at the input terminal H01, H02, H03 of the flip-flops 204, 205, 206 and of the waveform of the clock at the original clock input terminals CK' through CK3' of the flip-flops 204 through 206 results in one as shown in FIG. 11, and the circuit operates normally.

If there is one having the worst value (minimum value) of 2 [ns] of the delay time margin among the entire path, then it is returned again to the worst case path detecting means via the control means 10, which is repeatedly subjected to the foregoing process to increase its delay time margin. Thus the clock cycle corresponding to the delay time margin of the worst case path can be shortened.

The control means 101 in FIG. 8 controls each means of the entire system, and the output means 110 generates the final layout result.

What is claimed is:

1. A clock wiring designing apparatus for designing clock wiring of an LSI, PWB or the like, said clock wiring designing apparatus comprising:

delay analyzing means for evaluating delay time margins for a plurality of paths;

means for detecting a worst case path having a worst delay time margin among the delay time margins;

means for calculating a clock skew adjusting time by determining a difference between a delay time margin of a secondary worst case path and the worst delay time margin;

additional delay time calculating means for determining an optimum delay time to be added to a clock net leading to a clock input terminal at a terminal side of the worst case path within a range of the clock skew adjusting time; and means for inserting a delay gate in said clock net so that the delay time determined by the additional delay time calculating means is added to the clock net as an additional clock skew, whereby a total time margin is used between said worst case path and said secondary worst case path.

2. A clock wiring designing apparatus according to claim 1, further comprising a flip-flop connected between said paths, and a delay gate inserted by said means for inserting a delay gate to add an additional clock skew to said flip-flop.

3. A clock wiring designing apparatus for designing clock wiring of an LSI, PWB or the like, said clock wiring designing apparatus comprising:

a delay analyzing apparatus for evaluating a delay time margin for each of a plurality of paths;

means for detecting a worst case path having a worst delay time margin among the delay time margins;

clock skew adjusting time extracting means for calculating a difference between a delay time margin of a secondary worst case path and the worst delay time margin;

additional delay time calculating means for determining an optimum delay time to be added to a clock net leading to a clock input terminal at a terminal side of the worst case path within a range of the clock skew adjusting time;

means for inserting a delay gate in the clock net so that the delay time determined by the additional delay time calculating means is added to the clock net leading to the clock input terminal at the terminal side of the worst case path;

means for laying out the delay gate added by said delay gate inserting means and wiring the clock net leading to it;

delay analyzing result updating means for calculating an updated delay time margin for a path which has suffered a change to its clock skew as a result of the delay gate; and output means for generating a changed layout result incorporating the delay gate.

4. A clock wiring designing system comprising:

means for analyzing a delay time margin for each of a plurality of paths and storing the analyzed delay time margins into a storage means;

means for detecting a worst case path having a worst delay time margin based on the delay time margin for each path which is stored within said storage means;

clock skew adjusting time extracting means for calculating a difference between the worst delay time margin and a delay time margin of a secondary worst case path as the clock skew adjusting time;

additional delay time calculating means for calculating a time corresponding to a percentage of a clock skew adjusting time calculated by said clock skew adjusting time extracting means as an additional delay time;

means for changing a shape of a clock net so that the additional delay time calculated by said additional delay time calculating means is added to the clock net leading to a clock input terminal of a flip-flop at a terminal side of the worst case path detected by said worst case path detecting means; and delay analyzing result updating means for updating the delay time margin corresponding to the clock net whose shape has suffered a change by said clock net shape changing means among the delay time margins for each path stored within said storage means.

5. The system according to claim 4 wherein said delay time margin analyzing means analyzes the delay time margin for each path based on a maximum delay time of the delay times of each path, a delay time of each path and the time skew of each path.

6. The system according to claim 4 wherein said additional delay time calculating means uses ½ of the clock skew adjusting time calculated by said clock skew adjusting time extracting means as the additional delay time.

7. A system for designing clock wiring in designing layout of an LSI, PWB or the like comprising:

a plurality of flip-flops each having an area where art work patterns for adjusting a delay time are applied and disposed to apply the adjusted delay time to a clock input terminal;

input means for entering a layout result and delay analyzing information including interconnection information, art work pattern information for adjusting delay times and a layout of an entire block including flip-flop and clock net wiring;

delay analyzing means for evaluating a delay time margin of each of a plurality of paths for a clock cycle;

means for detecting a worst case path having a worst delay time margin from among the delay time margins;

clock skew adjusting time extracting means for calculating a difference between a delay time margin of secondary worst case path and the worst delay time margin as a clock skew adjusting time;

additional delay time calculating means for calculating an optimum delay time to be added to a clock net leading to a clock input terminal of a flip-flop at a terminal side of the worst case path within a range of said clock skew adjusting time;

an art work pattern disposing means for selecting an art work pattern having a delay time closest to said optimum delay time;

delay analyzing result updating means for calculating an updated delay time margin for a path whose clock skew has suffered a change by the disposition of said art work pattern by said art work pattern disposing means;

control means for driving said worst case path detecting means again if there is any other path having a delay time margin smaller than that of said worst case path updated by said delay analyzing result updating means; and output means for generating a layout result including said pattern.

8. A method of laying out clock wiring, comprising the steps of:

evaluating delay time margins for a plurality of paths;

detecting a worst case path having a worst delay time margin among the delay time margins;

calculating a clock skew adjusting time by determining a difference between a delay time margin of a secondary worst case path and the worst delay time margin;

determining an optimum delay to be added to a clock net leading to a clock input terminal at a terminal side of the worst case path, the optimum delay being a percentage of the calculated clock skew adjusting time; and providing a delay equal to the optimum delay coupled to said clock input terminal of said clock net, such that a clock rate can be faster than that dictated solely by said worst case path.

9. The method of claim 8, wherein the step of providing a delay equal to the optimum delay is accomplished by inserting a delay gate in the clock net.

10. The method of claim 9, wherein the optimum delay is calculated as about one half the calculated clock skew adjusting time.

11. The method of claim 9, wherein the optimum delay is one half the calculated clock skew adjusting time.

12. The method of claim 8, wherein the step of providing a delay equal to the optimum delay is accomplished by changing a shape of the clock net.

13. The method of claim 12, wherein the optimum delay is calculated as about one half the calculated clock skew adjusting time.

14. The method of claim 12, wherein the optimum delay is one half the calculated clock skew adjusting time.

15. The method of claim 8, wherein the step of providing a delay equal to the optimum delay is accomplished by selecting one of a plurality of art work patterns corresponding to the optimum delay, the plurality of art work patterns being previously included in an art work area of a flip-flop, said clock input terminal being an input terminal of said flip-flop.

16. The method of claim 15, wherein the optimum delay is calculated as about one half the calculated clock skew adjusting time.

17. The method of claim 15, wherein the optimum delay is one half the calculated clock skew adjusting time.

18. The method of claim 8, wherein the optimum delay is calculated as about one half the calculated clock skew adjusting time.

19. The method of claim 8, wherein the optimum delay is one half the calculated clock skew adjusting time.

* * * * *